US006311820B1

(12) United States Patent
Hallas Bell et al.

(10) Patent No.: US 6,311,820 B1
(45) Date of Patent: Nov. 6, 2001

(54) COIN VALIDATOR CALIBRATION

(75) Inventors: Malcolm Reginald Hallas Bell, Leeds; Robert Sydney Walker, Surrey; Dennis Wood; Les Hutton, both of Lancashire, all of (GB)

(73) Assignee: Coin Control Limited, Oldham Lancashire (GB)

( * ) Notice: Subject to any disclaimer, the term of this patent is extended or adjusted under 35 U.S.C. 154(b) by 0 days.

(21) Appl. No.: 09/194,818

(22) PCT Filed: May 20, 1997

(86) PCT No.: PCT/GB97/01358

§ 371 Date: May 10, 1999

§ 102(e) Date: May 10, 1999

(87) PCT Pub. No.: WO97/46984

PCT Pub. Date: Dec. 11, 1997

(30) Foreign Application Priority Data

Jun. 5, 1996 (GB) .................................................. 9611659

(51) Int. Cl.[7] .............................. G07D 5/08; G01R 35/00
(52) U.S. Cl. ............................................ 194/317; 324/601
(58) Field of Search .................................... 194/317, 318, 194/319; 324/601

(56) References Cited

U.S. PATENT DOCUMENTS 4,376,480 3/1983 Abe .
4,469,213 9/1984 Nicholson et al. .
4,538,719 9/1985 Gray et al. .

(List continued on next page.)

FOREIGN PATENT DOCUMENTS

| | | | |
|---|---|---|---|
| 0 155 126 | 9/1985 | (EP) | G07F/3/02 |
| 0 164 110 | 12/1985 | (EP) | G07F/3/02 |
| 0 384 375 | 8/1990 | (EP) | G07F/3/02 |
| 0 404 432 | 12/1990 | (EP) | G07F/3/02 |
| 0 155 126 B1 | 2/1991 | (EP) | G07F/3/02 |
| 0 164 110 B1 | 9/1991 | (EP) | G07F/3/02 |
| 0 384 375 B1 | 10/1993 | (EP) | G07F/3/02 |
| 0 404 432 B1 | 9/1994 | (EP) | G07F/3/02 |
| 418423 | 11/1934 | (GB) . | |
| 2 094 008 A | 9/1982 | (GB) | G01R/19/04 |
| 2 169 429 A | 7/1986 | (GB) | G07D/5/08 |
| 2 200 778 A | 8/1988 | (GB) | G07D/5/00 |
| 2 238 152 A | 5/1991 | (GB) | G07F/3/02 |
| WO 85/04037 | 9/1985 | (WO) | G07F/3/02 |

*Primary Examiner*—F. J. Bartuska
(74) *Attorney, Agent, or Firm*—Morgan & Finnegan LLP

(57) ABSTRACT

The coin validator is calibrated by inserting a calibration key different from coins to be validated in a static position in the validator such that eddy currents are induced in the key by operation of its sensor coils so as to produce a calibration value of signals form the sensor coils as a function of the individual characteristics of the validator. The calibrating value of the sensor signals may be compared with ensemble data concerning corresponding calibration values derived from an ensemble of coin validators of the same design.

35 Claims, 9 Drawing Sheets

U.S. PATENT DOCUMENTS

| | | | | |
|---|---|---|---|---|
| 4,570,779 | | 2/1986 | Abe | 194/318 |
| 4,601,380 | | 7/1986 | Dean et al. | 194/318 |
| 4,686,365 | | 8/1987 | Meek et al. | 250/281 |
| 4,749,074 | | 6/1988 | Ueki et al. | 194/317 |
| 4,754,862 | | 7/1988 | Rawicz-Szczerbo et al. | 194/319 |
| 4,845,994 | | 7/1989 | Quinlan, Jr. | 73/163 |
| 4,951,800 | | 8/1990 | Yoshihara | 194/317 |
| 4,995,497 | | 2/1991 | Kai et al. | 194/318 |
| 5,007,520 | | 4/1991 | Harris et al. | 194/317 |
| 5,033,603 | | 7/1991 | Kai et al. | 194/334 |
| 5,062,518 | | 11/1991 | Chitty et al. | 194/317 |
| 5,085,309 | | 2/1992 | Adamson et al. | 194/317 |
| 5,155,960 | | 10/1992 | Shaanan | 52/584 |
| 5,158,166 | | 10/1992 | Barson | 194/319 |
| 5,180,046 | | 1/1993 | Hutton et al. | 194/319 |
| 5,226,520 | | 7/1993 | Parker | 194/317 |
| 5,379,876 | | 1/1995 | Hutton | 194/319 |
| 5,469,952 | | 11/1995 | Kershaw et al. | 194/317 |
| 5,489,015 | | 2/1996 | Wood | 194/318 |
| 5,495,931 | * | 3/1996 | Meyer-Steffens et al. | 194/317 |
| 5,515,960 | | 5/1996 | Wood | 194/328 |
| 5,577,591 | | 11/1996 | Abe | 194/343 |
| 5,657,847 | | 8/1997 | Tod et al. | 194/207 |

* cited by examiner

COIN VALIDATOR CALIBRATION

FIELD OF THE INVENTION

This invention relates to calibrating coin validators in order to permit each validator to be provided with accurate data concerning acceptable coins, that can be compared with coin data derived from coins to be validated, in order to determine coin acceptability.

BACKGROUND

Coin validators which discriminate between coins of different denominations are well known and one example is described in our GB-A-2 169 429. This coin validator includes a coin rundown path along which coins pass edgewise through a coin sensing station at which a series of inductive tests are performed on the coins with sensor coils in order to develop sensor signals which are indicative of the size and metallic content of the coin under test. The sensor signals are digitised so as to provide coin data, which are then compared with stored data by means of a microprocessor to determine the acceptability or otherwise of the coin under test. If the coin is found to be acceptable, the microprocessor operates an accept gate so that the coin is directed to an accept path. Otherwise, the accept gate remains inoperative and the coin is directed to a reject path.

The stored data are representative of acceptable values of the coin data. The stored data in theory could be represented by a single digital value but in practice, the coin parameter data varies from coin to coin, due to differences in the coins themselves and consequently, it is usual to store the data as window data corresponding to windows or ranges of acceptable values of the coin data.

The window data needs to vary from validator to validator due to minor manufacturing differences that occur between validators manufactured to the same design. Consequently, it is not possible to program a fixed set of window data into mass produced coin validators of the same design. A conventional solution to this problem is to calibrate the validators individually by passing a series of known true coins of a particular denomination through the validator so as to derive test data from which appropriate window data can be computed and stored in the memory of the validator. Reference is directed to GB-A-1 452 740. This calibration method is however, time consuming because a group of test coins for each denomination needs to be passed through the validator in order to derive data from which the windows can be computed.

Another calibration method is described in EP-A-0 072 189. In this method, first and second tokens in the form of metal discs are passed through the validator and subject to the same inductive tests as coins to be validated. The tokens are chosen to have different characteristics to the coins to be validated. During set up of the validator, the tokens are passed sequentially through the inductive sensing station and the resultant data are then compared with standard values from which calibration factors are calculated. A series of standard acceptable values of the coin data are provided and the calibration factors are applied to the standard data to derive suitable compensated values of acceptable coin data to be stored in the memory of the individual validator being calibrated.

A calibration tool is disclosed in U.S. Pat. No. 5,495,931, which is inserted into the coin rundown path. The tool includes a coil which is energisable to induce signals to the sensor coils which emulate a coin and can be used to calibrate the validator. Reference is also directed to EP-A-0 602 474 which discloses a calibration method that uses calibration discs, and a calibration algorithm in the form of a Taylor series.

These prior methods suffer a number of disadvantages. The use of calibration discs has the disadvantage that the calibration data derived from the inductive tests is produced in response to the disc rolling through the validator, which limits the accuracy that can be obtained. Furthermore, the standard values of true coins that are compensated according to the calibration factors, are not necessarily accurate. The actively energised calibration tool may not in practice provide consistent results due to differences in inductive coupling, from validator to validator.

The present invention seeks to overcome these problems.

SUMMARY OF THE INVENTION

According to the invention from a first aspect there is provided a method of calibrating a coin validator that includes a path for coins to be validated and at least one inductive sensor means for forming an inductive coupling with a coin as it passes along the path thereby to produce a sensor signal to be compared with coin data for determining authenticity of the coin, the sensor signal being of a value dependent upon characteristics of the validator, comprising inserting a calibration key different from coins to be validated in a static position in the validator such that eddy currents are induced in the key by operation of the sensor means, so as to produce a calibration value of the sensor signal as a function of the individual characteristics of the validator.

By using a calibration key in a static position in the validator, a much more accurate calibration value of the sensor signal may be obtained than with moving calibration token used hitherto.

The key may then be removed in order to allow the validator to be used for coin validation of coins under test.

The validator may include a coin rundown path disposed between the side walls which are movable relative to one another, for example to allow coins that have become jammed in the rundown path to be removed, and the method according to the invention may include the steps of moving the side walls apart, inserting the calibration key into the rundown path at a predetermined location, closing the side walls, and then forming the inductive coupling with the key in order to derive the calibration value of the coin signal.

The inductive sensor means may comprise a plurality of inductor coils so that respective inductive couplings are formed between the coils and the key. The shape of the key may be configured in order to optimise the respective inductive couplings. The coupling may be produced sequentially, for example by energising the coils sequentially so that the individual inductive couplings between the coils and the key can be monitored.

In another aspect, the invention provides a method of calibrating a coin validator that includes a path for coins to be validated and at least one inductive sensor means for forming an inductive coupling with a coin as it passes along the path thereby to produce a sensor signal to be compared with coin data for determining authenticity of the coin, the sensor signal being of a value dependent upon characteristics of the validator, comprising: inserting a calibration key different from coins to be validated in a static position in the validator such as to produce an inductive coupling with the sensor means, so as to produce a calibration value of the sensor signal as a function of the individual characteristics of the validator, comparing the calibration value of the sensor signal with ensemble data concerning corresponding calibration values of the sensor signal derived from an ensemble of coin validators of said design, and determining, as a function of the comparison, for said validator being calibrated, a value of the sensor signal corresponding to a particular coin denomination, that is compensated in respect of the individual characteristics of the validator.

Data concerning the compensated value of the sensor signal may be stored in the validator being calibrated, for example in a semiconductor memory. The compensated value may be stored as window data corresponding to a window of acceptable values of the coin signal in order to accommodate variations from coin to coin. Additionally, data concerning the calibration value of the sensor signal may be stored in the validator to allow subsequent reprogramming. The validator can then be reprogrammed to accept different denominations of coins, and this can be achieved by computing a compensated value of a sensor signal for a coin of a different denomination by reference to the stored value of the calibration signal and an ensemble average of the coin signal for the different denomination. This can be carried out after manufacture, for example in the field.

Alternatively, calibration can be achieved by providing a database of validator data sets derived from an ensemble of coin validators of the same design as the validator being calibrated, each data set comprising said calibration value for a respective individual validator of the ensemble and a value of the coin signal produced in response to a true coin of a particular denomination of the is individual validator, and selecting at least one of the data sets in dependence upon a comparison of the coin signal calibration value for the validator being calibrated with the corresponding calibration values of the data sets.

More than one calibration value of the sensor signal for an individual validator may be derived by inserting a plurality of different ones of said keys in the rundown path so as to form different inductive couplings with the inductive means.

The invention also includes coin validator calibration apparatus including a coin validator that includes a path for coins to be validated and at least one inductive means for forming an inductive coupling with a coin as it passes along the path thereby to produce a sensor signal to be compared with coin data for determining authenticity of the coin, the sensor signal being of a value dependent upon characteristics of the validator, and a calibration key, different from coins to be validated, configured to be mountable in a static position in the validator such that eddy currents are induced in the key by operation of the inductor means, so as to produce a calibration value of the sensor signal as a function of the individual characteristics of the validator.

Preferably, the calibration key is of a shape which self-locates in the rundown path at a predetermined location. Alternatively, the key can be inserted into a carrier which is inserted into the coin path. The validator may include a door which is openable to allow the key to be inserted at the predetermined location, so as to form the inductive coupling with the inductive means, and thereafter removed, prior to use of the validator for coin validation.

The invention also extends to a method of calibrating a coin validator of a predetermined design that includes a path for coins to be validated and at least one inductive sensor means for forming an inductive coupling with a coin as it passes along the path thereby to produce a sensor signal to be compared with coin data for determining authenticity of the coin, the sensor signal being of a value dependent upon characteristics which may vary from validator to validator, comprising forming a calibration inductive coupling with the inductive means whereby to produce a calibration value of the sensor signal as a function of individual characteristics of the validator, comparing the calibration value of the sensor signal with data concerning corresponding calibration values of the sensor signal derived from an ensemble of coin validators of said design and sensor signals produced by the validators of the ensemble in response to a true coin of a particular denomination, such as to derive for the validator being calibrated a value of the sensor signal for said denomination, that is compensated in respect of the individual characteristics of the validator, the calibration value of the sensor signal being compared with data from a database of validator data sets derived from said ensemble of coin validators of said design, each set comprising said calibration value for a respective individual validator of the ensemble and a value of the sensor signal produced in response to a true coin of a particular denomination by the individual validator.

Data may be selected from the data sets in dependence upon a comparison of the sensor signal calibration value for the validator being calibrated, with the corresponding calibration values of the data sets.

A plurality of average values of the difference between the calibration value of the sensor signal and the corresponding sensor value for the true coin, may be formed from the data sets, for the data sets in which the calibration value of the sensor signal falls within predetermined respective ranges of values thereof. Data concerning said ranges and the average values can be transmitted to the coin validator to be calibrated, and one of said ranges may then be selected by comparing the calibration value of the sensor signal for the validator being calibrated, with said ranges, and the average value for the selected range may be combined with the calibration value of the sensor signal for the validator being calibrated, so as to provide the compensated value of the sensor signal for the validator being calibrated. The transmitted data may be fed from a is central location to a plurality of validators to be calibrated at remote locations, or to individual validators in response to a request from the validator location.

BRIEF DESCRIPTION OF THE DRAWINGS

In order that the invention may be more fully understood embodiments thereof will now be described by way of example with reference to the accompanying drawings, in which.

DETAILED DESCRIPTION

Figure 1:
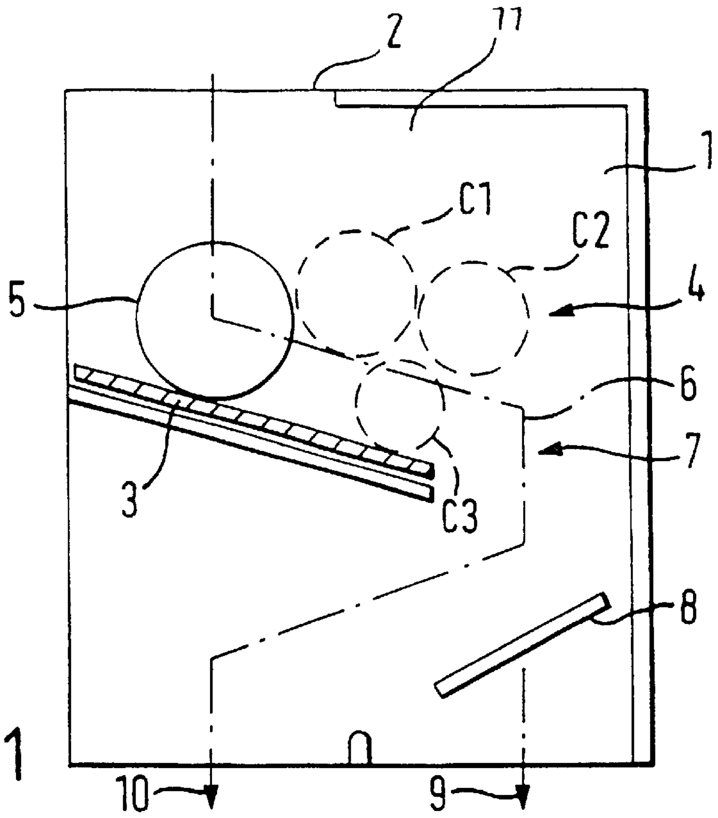
FIG. 1 is a schematic elevational view of a coin rundown path through a coin validator to be calibrated in accordance with the invention, with its reject gate not shown.

Referring to FIG. 1, a coin validator consists of a body 1 including a coin inlet 2 into which coins are inserted from above so as to fall onto an inclined coin rundown surface 3 and then roll edgewise through an inductive coin sensing station 4 which includes sensing coils C1, C2, and C3 shown in dotted outline. A coin 5 is shown on the inclined rundown surface 3, which moves along a path 6 shown in dotted outline.

At the end of the inclined rundown surface 3, the coin falls through an opening 7 towards the solenoid operated accept gate 8 that either allows the coin to enter an accept path 9 or directs the coin along a reject path 10. The accept gate is operated by circuitry responsive to the inductive sensing coils C1–3 at the sensing station 4 so that if the coin is determined to be of acceptable characteristics, the gate 8 is opened by a sliding operation normal to the plane of the paper in FIG. 1, so that the coin can fall along path 9 and be accepted. The passage of the coin into the accept path may be directed by a further sensor (not shown). Otherwise, the gate 8 remains closed so as Is to block the accept path and as a result, the coin is deflected by the gate into the reject path 10.

Figure 2:
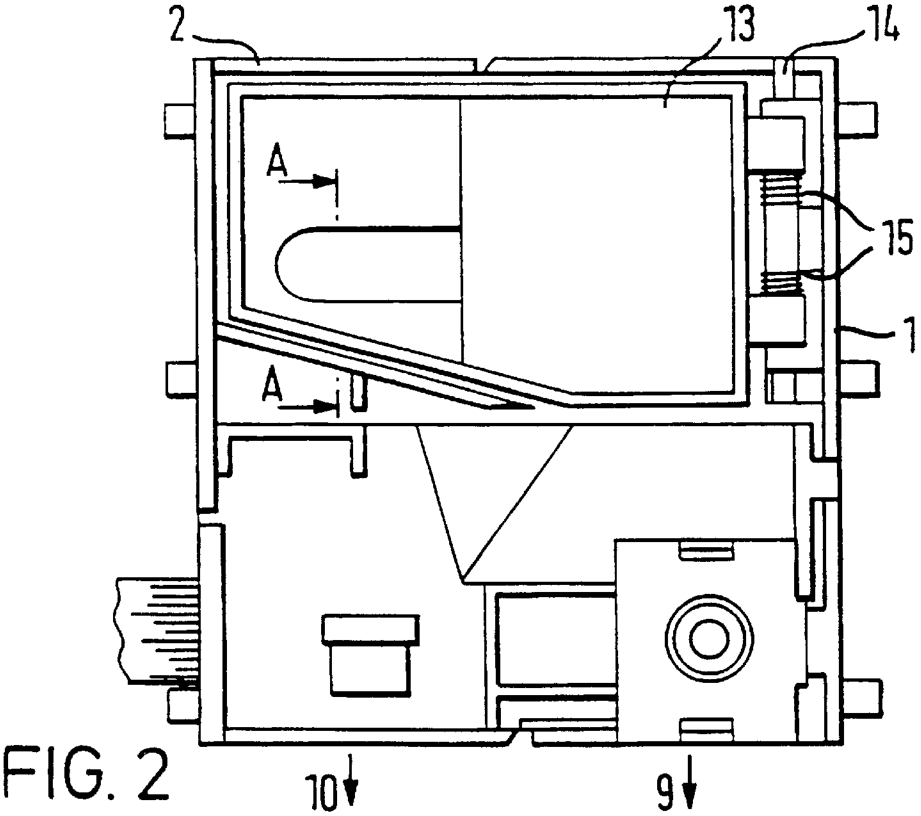
FIG. 2 is an elevational view of the validator shown in FIG. 1, from one side, showing the reject gate.
Figure 3:
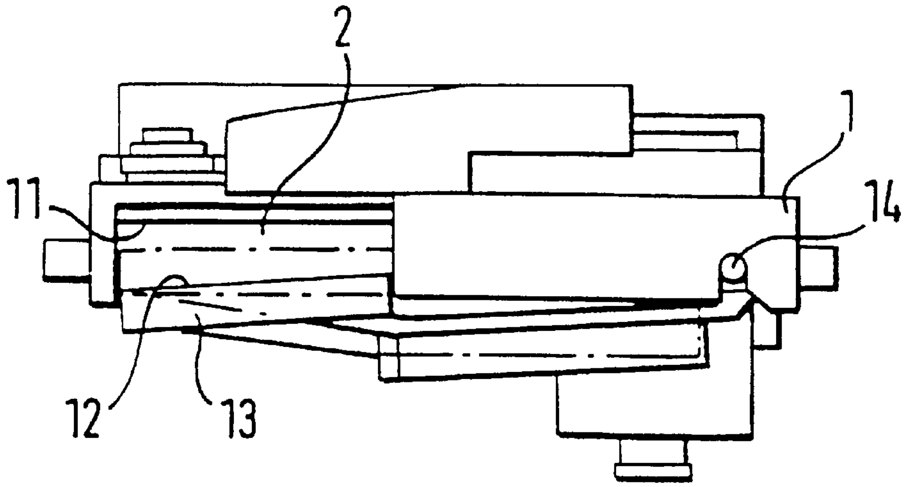
FIG. 3 is a top plan view of the validator shown in FIG. 2.
Figure 4:
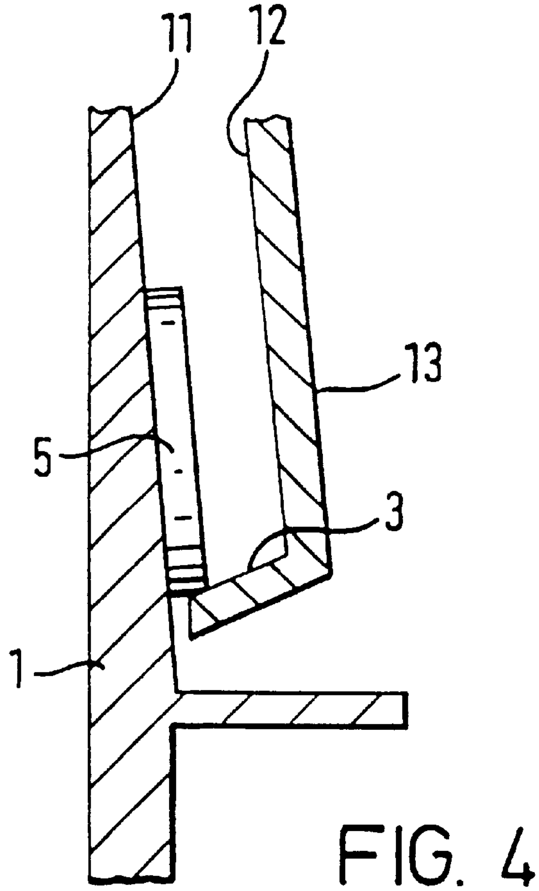
FIG. 4 is a partial schematic sectional view taken along the line A—A' shown in FIG. 2.

The coin 5 runs in a gap between opposed side walls which, as can be seen in FIGS. 2, 3 and 4, are defined by a wall 11 on the body 1 of the validator and an interior wall 12 of a rundown gate 13 which is hinged about a substantially vertical axis on a shaft 14 mounted on the body 1. The main rundown surface 3 comprises a ledge formed on the bottom edge of the rundown gate 13 (FIG. 4). The rundown gate 13 is normally biassed to a closed position by springs 15 so that the walls 11, 12 are generally parallel to one another as shown in hatched outline in FIG. 3. However, the rundown gate 13 can be hinged outwardly as shown in solid outline in FIG. 3, by operation of a reject lever in a manner known per se in order to release coins in the rundown path, in the event of a coin jam. Also, the gate 13 can be opened further in order to provide access to the rundown path as will be explained in more detail hereinafter.

Figure 5:
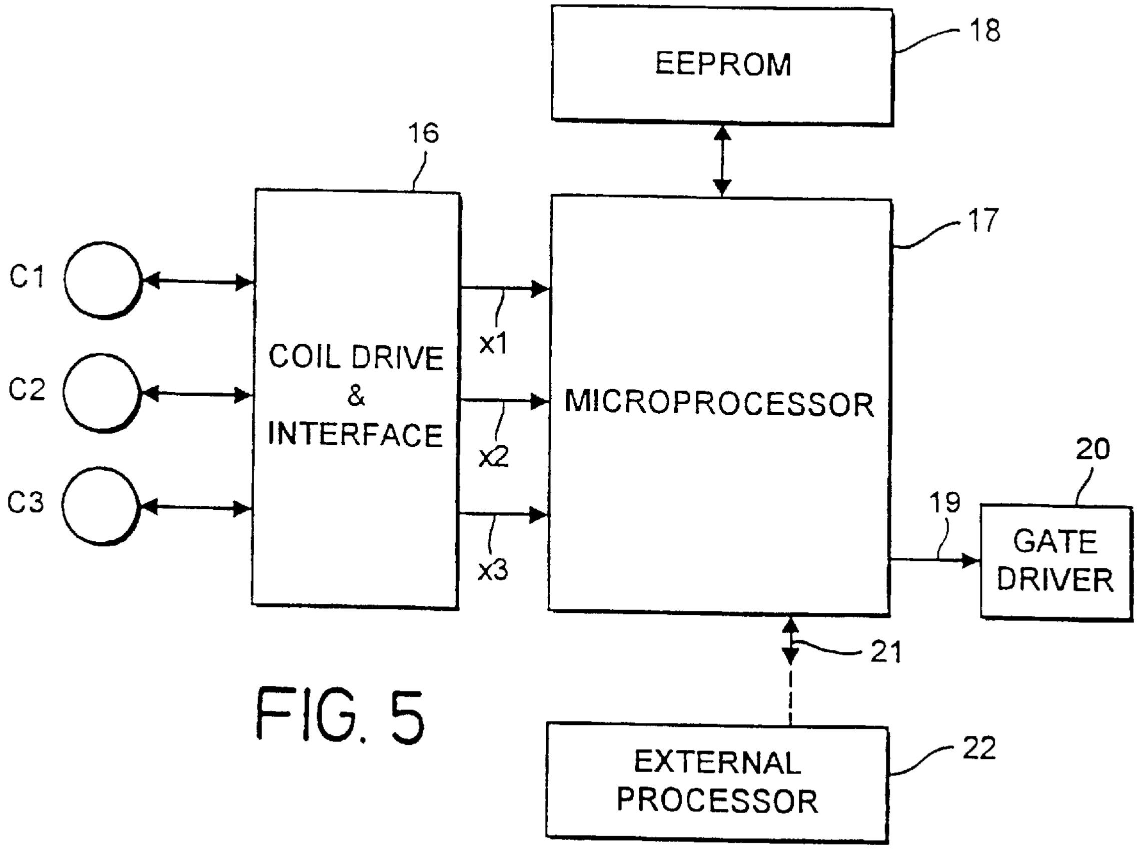
FIG. 5 illustrates schematically electrical circuits of the validator.

The three sensing coil circuits C1–3 at the coin sensing station 4 shown in FIG. 1, are mounted in the validator body. Each circuit comprises a pair of coils connected in series on opposite sides of the coin rundown path, one of the coins being mounted behind the wall 11 and the other in the rundown gate 13, and they are energised in order to provide an inductive coupling with the coin that runs along the coin rundown path 3. The coils are of different geometrical configurations and are energised at different frequencies by a drive and interface circuit 16 shown in FIG. 5 mounted in the validator body. The different inductive couplings between the three coils and the coin have been found to characterise the coin substantially uniquely, in terms of its metallic content and physical dimensions. The drive and interface circuit 16 produces three corresponding sensor signals $x_1$, $x_2$, $x_3$ as a function of the different inductive couplings between the coin 5 and the coils C1–3. The sensor signals $x_1$, $x_2$, $_{x3}$ can be formed in a number of different known ways. One way is described in detail in our GB-A-2 169 429. In this method, the coils are included in individual resonant circuits which are maintained at their natural resonant frequency as the coin passes the coil. The frequency changes on a transitory basis as a result of the momentary change in impedance of the coil produced by the inductive coupling with the coin. This change in impedance produces a change both in amplitude and frequency. As described in our prior specification, the peak amplitude deviation is monitored as the coin passes the coils, and is digitised in order to provide the sensor signal x for each coil circuit. By maintaining the drive frequency for the coil circuit at its natural resonant frequency during passage of the coin past the coil, the amplitude deviation is emphasised so as to aid in discrimination between coins. However, the signals can be formed in other ways, for example by monitoring the frequency produced as the coin passes the coils and reference is directed to GB-A-1 452 740, or by monitoring phase changes as a coin passes the coils.

In order to determine coin authenticity, the three sensor signals $x_1$, $x_2$, $x_3$ produced by the coin under test are fed to a microprocessor 17 which is coupled to memory means in the form of an EEPROM 18 in the validator.

The microprocessor 17 compares the sensor signals derived from the coin under test with corresponding stored values held in the EEPROM 18. The stored values are stored in terms of windows having upper and lower limits. Thus, if the individual sensor signals $x_1$, $x_2$, $x_3$ fall within the corresponding windows associated with a true coin of a particular denomination, the coin is considered to be acceptable, but otherwise is rejected. If acceptable, a signal is provided on line 19 to a drive circuit 20 which operates the gate 8 shown in FIG. 1 so as to allow the coin to pass to the accept path 9. Otherwise, the gate is not opened and the coin passes to the reject path 10. During the coin validation process, the microprocessor compares the sensor signals $x_1$, $x_2$ and $x_3$ with a number of different sets of operating window data appropriate for coins of different denominations so that the coin validator can accept or reject more than one coin of a particular currency set.

The present invention is concerned with providing the stored data in the memory 18 of the validator that can be used for comparison purposes with the coin parameter signals derived from coins under test. Validators that are mass produced to the same design do not have exactly the same characteristics as a result of manufacturing tolerances.

Consequently, the value of the data stored in the EEPROM 18 needs to be slightly different from validator to validator in order to optimise coin discrirmination between coins of different denominations. The present invention is concerned with optimising the values of the stored data in order to compensate for individual differences in the characteristics of the validators, which occur from validator to validator.

Examples of the calibration process according to the invention will now be described. In the following examples, calibration values of the individual sensor signals $x_1$, $x_2$, $X_3$ are derived from an individual validator during a calibration procedure and the resulting calibration values of the sensor signals are then compared with similar signals derived from an ensemble of coin validators manufactured to the same design as the validator being calibrated. This enables the characteristics of the individual validator to be determined so that coin parameter data representative of acceptable coins can be suitably programmed into the validator, taking account of its individual characteristics.

Figure 6:
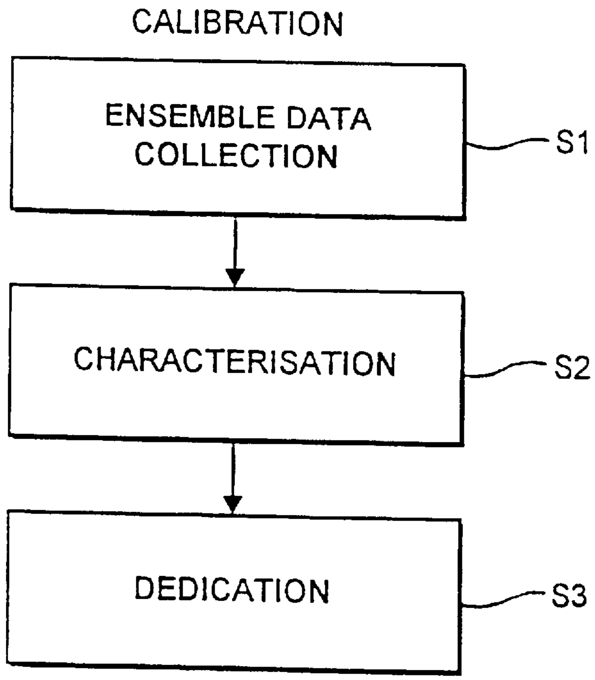
FIG. 6 is a schematic block diagram of the main process steps performed to calibrate the coin validator.

The calibration process can be considered to consist of three major steps as shown in FIG. 6. In the first step S1, an ensemble of data is collected concerning the characteristics of an ensemble of coin validators all manufactured to the same design. At step S2, an individual validator to be calibrated, is characterised with reference to the ensemble data collected at step S1. At step S3, the individual validator is dedicated with coin parameter the reference data representative of acceptable coins of different denominations, the reference data having been selected in dependence upon the result of the characterisation step S2. Three main different characterisation and dedication methods will be described in detail hereinafter.

Figure 7:
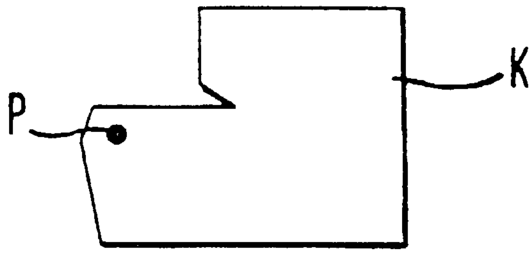
FIG. 7 is a schematic side view of a calibration key for use in a method according to the invention.

In the following examples, the ensemble data collection step S1 and the characterisation step S2 both make use of a calibration key K and an example is shown in FIG. 7.

Figure 8:
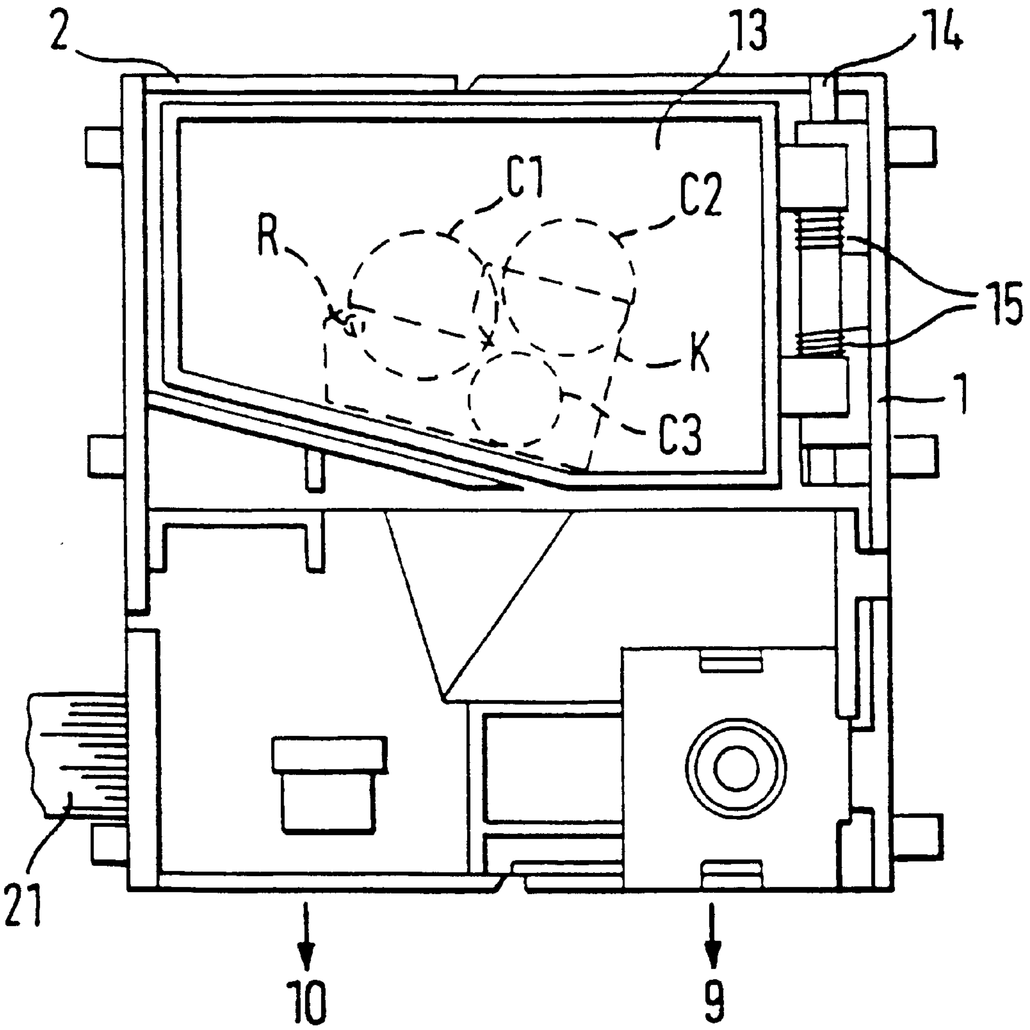
FIG. 8 is a schematic elevational view of the validator shown in FIG. 2 illustrating the calibration key in situ.

The key consists of a metal plate, typically made of brass or some other suitable alloy such as nickel copper, in order to produce a particular inductive coupling with the coils C1, C2 and C3 at the sensing station 4 shown in FIG. 1. The calibration key K is inserted into the validator at a fixed, static position as shown in FIG. 8. The key K is inserted into the validator by opening the rundown door 13 and placing the key on the coin rundown path. The key K is configured so that it self-aligns at a particular location. It includes a pin P which locates in a recess R in the rundown door 13. This can be seen in FIG. 8. The key has a peripheral configuration which completely overlies the diameter of coil C3 and partially obscures coil C1 and C2. Thus, different inductive couplings are formed with the coils C1, C2 and C3 individually. The key K thus provides a reference against which the validator can be calibrated in terms of the inductive coupling of the sensor coils C1–C3. The reference is different from the inductive couplings produced by coins under test. As will be apparent hereinafter, keys of different materials and/or shapes may be used in the method according to the invention to produce different sets of calibration values of the sensor signals. Also, instead of self-locating in the rundown path, the key may be inserted in a key carrier (not shown), which itself is inserted into the path to locate the key in place next to the coils C1–3.

The data collection step S1 for the ensemble of coin validators will now be described with reference to FIG. 9. At step S1.1 the first validator of the ensemble is connected to an external processor 22 (shown in FIG. 5) such as a personal computer, by means of a connection 21 (FIGS. 5 and 8) to the bus of the microprocessor 17. Then at step S1.2, a first calibration key $K_1$ is inserted in the coin rundown path in the manner shown in FIG. 8. The sensor coil circuits C1, C2 and C3 are sequentially energised, one at a time, by the driver circuit 16 shown in FIG. 5 so as to produce sequential calibration values of the sensor signals $x_1$, $x_2$, $X_3$. It will be understood that these signals are digital. Because the key is located in a static position, the coil circuits can be energised for a longer period than for a coin rolling along the rundown path, permitting highly accurate calibration values to be obtained. The microprocessor 17 is configured to send the calibration values to the external processor 22, where they are stored.

At step S1.3, the first key $K_1$ is replaced by a second calibration key $K_2$ which may be made of a different material and/or which is of a different shape, so as to produce a second, different set of inductive couplings with the coils C1, C2, C3. The energisation process is repeated and the calibration values of the coin signals for the second key are similarly stored in the external processor.

Then the key $K_2$ is removed and, at step S1.4, a set of known true coins of a particular denomination, is fed into the validator. The values of the sensor signals $x_1$, $x_2$, $x_3$ produced by the known true coin are directed by the microprocessor 17 to the external processor 22, where they are averaged for each signal $x_1$, $x_2$, $x_3$, and the average values are stored.

At step S1.5, the process is repeated until sets of data have been collected from all of the coin validators in the ensemble. The ensemble may typically comprise 50–200 validators.

When all of the data has been collected from the validators of the ensemble, it is processed at step S1.6 in the external processor 22.

In the first example of the invention, an average value of the data produced for each of the coils is produced for the ensemble of validators. The data received from the coils C1, C2 and C3 for the ensemble of validators is considered separately. In this example, the outputs from the coils C1 will be considered and it will be understood that the outputs from coils C2 and C3 is are processed in a similar way. Firstly, an ensemble average value $k_{av}$ is produced for the values of the sensor signal $x_1$ produced by the validators of the ensemble in response to the first calibration key $K_1$. A similar signal $k_{av}$ is produced from the calibration values of $x_1$ produced in response to the second calibration key $K_2$ for the ensemble. Additionally, an average ensemble value $t_{av}$ is produced for the stored value of the sensor signal $x_1$ produced in response to the true coin introduced at step S1.4. Thus, the end of step S1.6 (FIG. 9) ensemble averages $k1_{av}$, $k2_{av}$ and $t_{av}$ are produced in respect of each of the coils C1, C2, and C3 respectively, which are stored in the external processor 22. This data can then be used in a process which allows individual validators to be characterised as they are manufactured, at step S2 of FIG. 6. This step will now be described in more detail with reference to FIG. 10.

Step S2.0, denotes the start of a procedure in which a newly manufactured validator from the production line is characterised in respect of its individual characteristics that result from manufacturing tolerances during the production process. At step S2:1 the validator is connected to the external processor 22 in the manner shown in FIG. 5 and a first key K1 is inserted into the coin rundown path of the validator as shown in FIG. 8. The key K1 is of the same design as the key $K_1$ that was used during the data collection process of FIG. 9 and hence has the same key characteristics. At step S2.2, the sensor signals $x_1$, $x_2$, $X_3$ are measured to provide individual calibration values Ik1 for the validator. The calibration value Ik1 for each coil circuit C1–C3 is then stored in the external processor 22.

Figure 9:
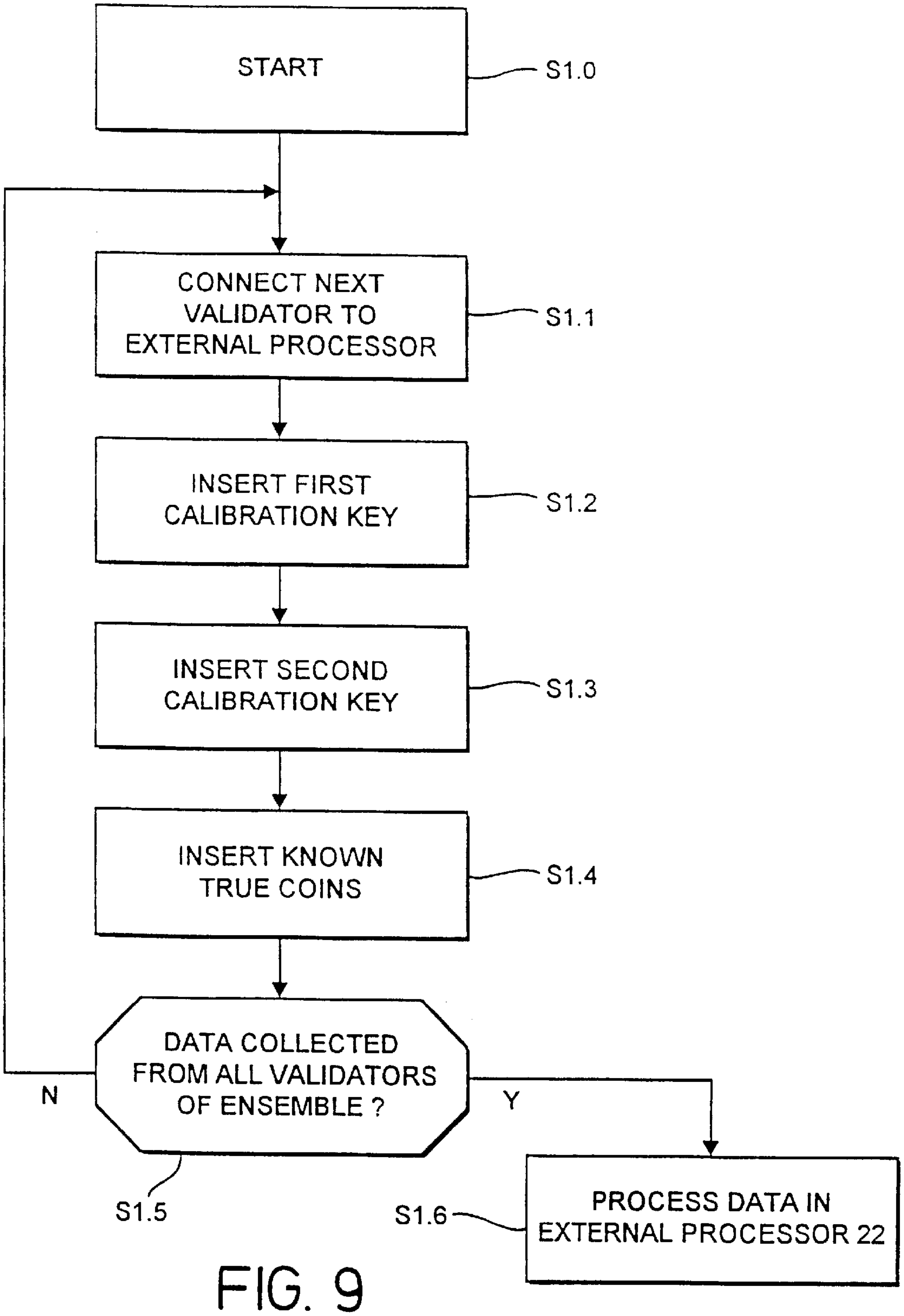
FIG. 9 is a more detailed flow diagram of the steps performed during the ensemble data collection shown in FIG. 6.
Figure 10:
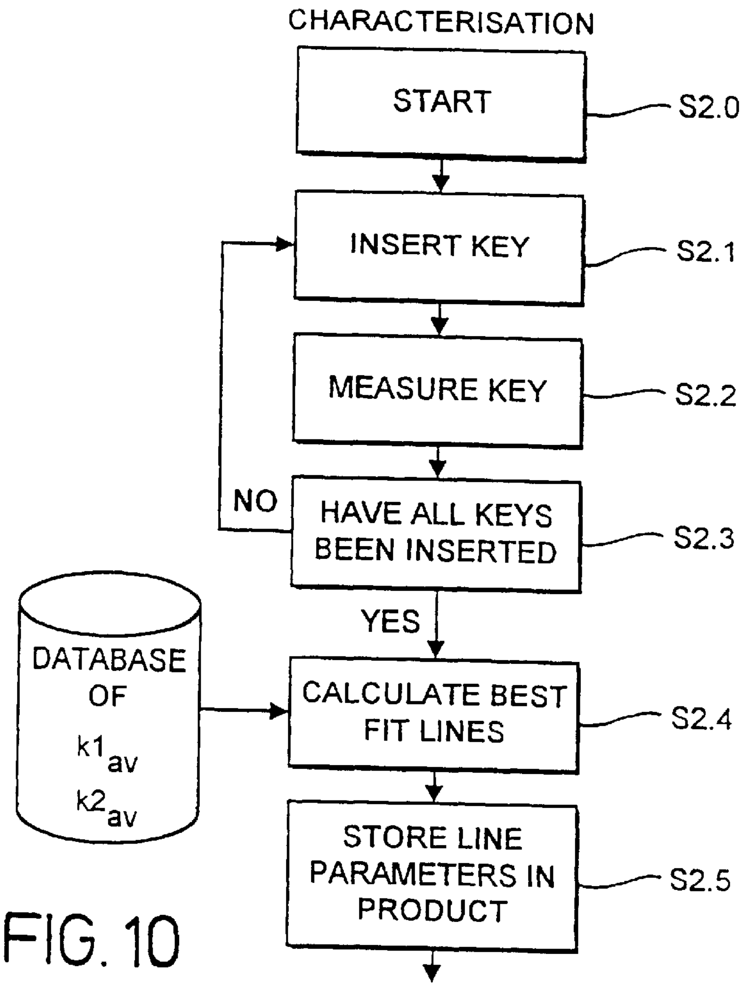
FIG. 10 illustrates in more detail one example of the characterisation step shown in FIG. 6.

At step S2.3, the process is repeated in respect of the second key $K_2$ that was used during the data collection process of FIG. 9, namely with a second key K2 with the same characteristic as $K_2$. The resultant coin calibration value Ik2 for each of the coils is stored in the external processor 22.

Figure 11:
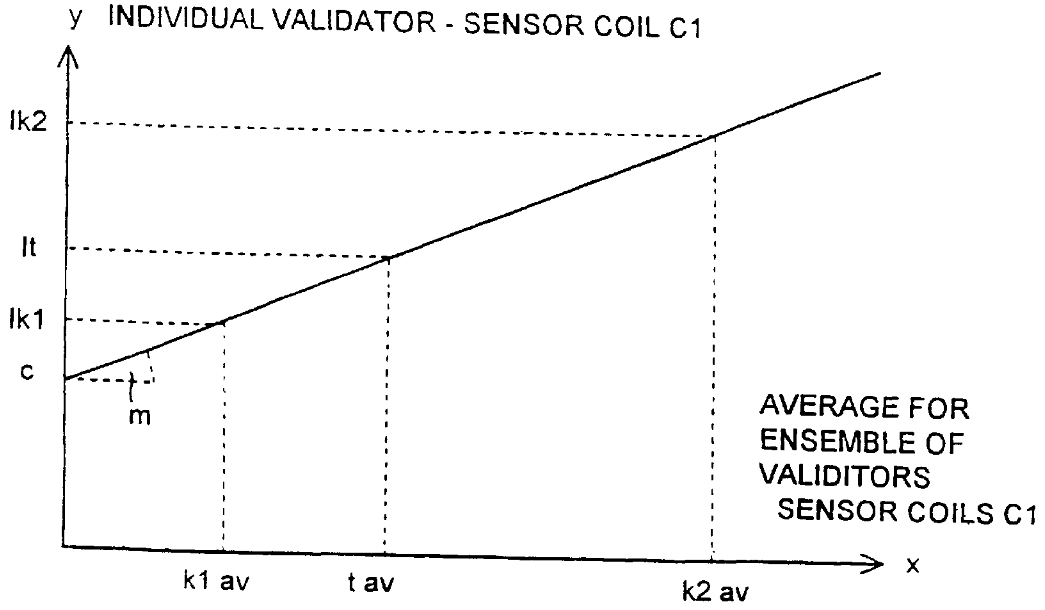
FIG. 11 is a graph of the relationship between the ensemble averages of the calibration values of the coin signal derived from the calibration keys and a true coin (x-axis), with the corresponding individual values for a validator being calibrated (y-axis)

When both of the keys have been inserted and removed from the validator, the process moves to step S2.4 at which the individual values Ik1 and Ik2 are compared with the corresponding average values $k1_{av}$ and $k2_{av}$. Referring to FIG. 11, it has been found according to the invention that a plot of the calibration values Ik1, Ik2 against the corresponding average values $k1_{av}$ and $k2_{av}$ approximates to a straight line when considering one of the sensor coil circuits e.g. sensor coil circuit C1. If additional different calibration keys are used, the average values $kn_{av}$ and the corresponding individual values Ikn lie on the same straight line. Similarly, the value $t_{av}$ and a corresponding individual value It for a true coin fall on the same straight line. Thus, by referencing the value $t_{av}$ to the graph shown in FIG. 11 (on the x axis) it is possible to read off from the graph (on the y axis) an individual true value for the particular coin denomination, for the individual validator being calibrated.

In this example of the invention, data concerning the slope and intercept of the graph shown in FIG. 11 is stored in the individual validator. It will be understood that the straight line graph shown in FIG. 11 is of the form $$y=mx+c$$

where m is the gradient and c is y axis intercept and so from the values Ik1 and Ik2 derived from the individual validator to be calibrated, together with the average values $k1_{av}$ and $k2_{av}$ it is possible to compute the value of the intercept c and the slope m of the graph. The values in and c are computed by the external processor 22, using the data collected during steps S1 and step S2.2, at step S2.4 shown in FIG. 10 and then, at step S2.5, the values of m and c are stored in the memory 18 of the individual validator being calibrated. Corresponding values of in and c for each of the sensor coil circuits C1, C2 and C3 are stored in the memory 18.

Figure 12:
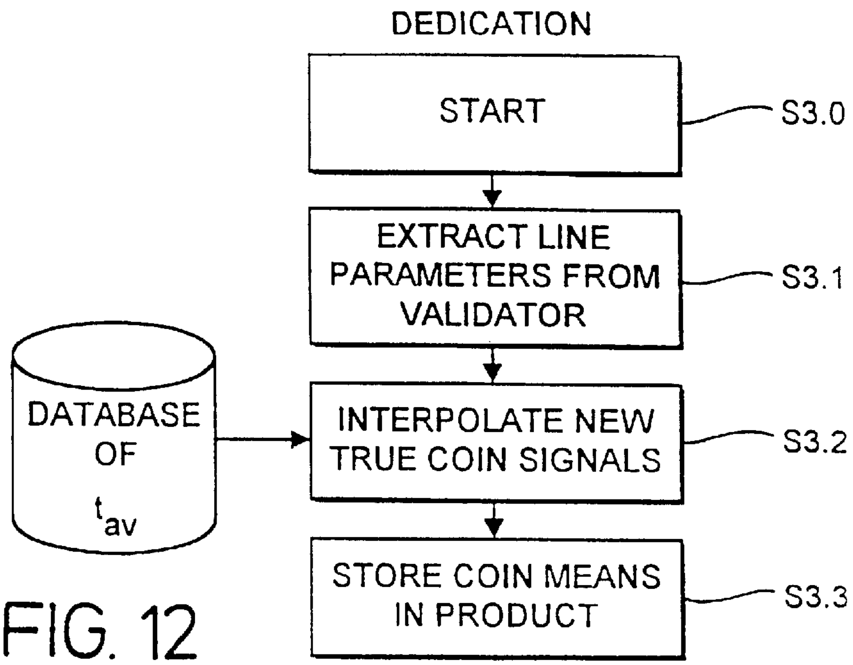
FIG. 12 illustrates in more detail one example of the dedication step shown in FIG. 6, for use with the characterisation steps described with reference to FIG. 10.

Thereafter, the individual validator is dedicated to accept true coins of a number of different denominations (step S3 of FIG. 6) which will now be described in detail with reference to FIG. 12.

At step S3.0, the external processor 22 is connected to an individual validator and at step S3.1, the slope and intercept parameters m and c are read from the memory 18 of the validator for each of the coil circuits C1, C2 and C3. At step S3.2, the straight line graph of FIG. 11 is effectively reconstructed by the processor 22 and then the previously computed average value $t_{av}$ for a true coin is interpolated so as to derive an individual true value for the validator concerned. This can be understood by referring to FIG. 11. An individual true value It for the validator can be determined from the y axis of the graph, at the point of intersection of the x-ordinate value $t_{av}$ and the line of the graph. It will be understood that the processor 22 can readily compute this value from the value $t_{av}$ and the retrieved values of m and c, for each of the sensor coil circuits C1, C2 and C3 respectively. The resulting individual values It for the three coil circuits C1, C2 and C3 are then stored in the memory 18 of the validator, at step S3.3. In fact, as previously mentioned, the individual values are stored as windows with upper and lower limits disposed above and below the value It, in order to provide an acceptance window to take account of differences in the coin signals produced by different true coins of the same denomination, which in practice are found to occur from coin to coin.

The validator is then ready for operation and the stored windows can be compared with the sensor signals $X_1$, $x_2$, and $x_3$ produced by coins under test that pass through the validator.

It will be understood that during the data collection step of S1, appropriate mean values for a number of different true coins can be produced by feeding a set of coins of different denominations through each of the validators of the ensemble and producing corresponding averages; step S1.4 can be repeated for different true coins, so that during the dedication step S3, the routine S3.3 can be repeated for different true coins, to enable windows for true coins of different denominations to be stored in the memory of the validator, to allow it to validate a number of different coin denominations.

It is not necessary to program acceptance windows for all of the true coins at the time of manufacture. It is possible to repeat the dedication step S3, later, in the field if necessary, in order to change the coin denominations to be accepted by the validator. To this end, the external processor 22 is connected to the validator, the stored values of m and c are extracted at step S3.1 and then, at step S3.2, new individual values It are computed as previously described, using values $t_{av}$ appropriate for new acceptable coins for the validator.

Figure 13:
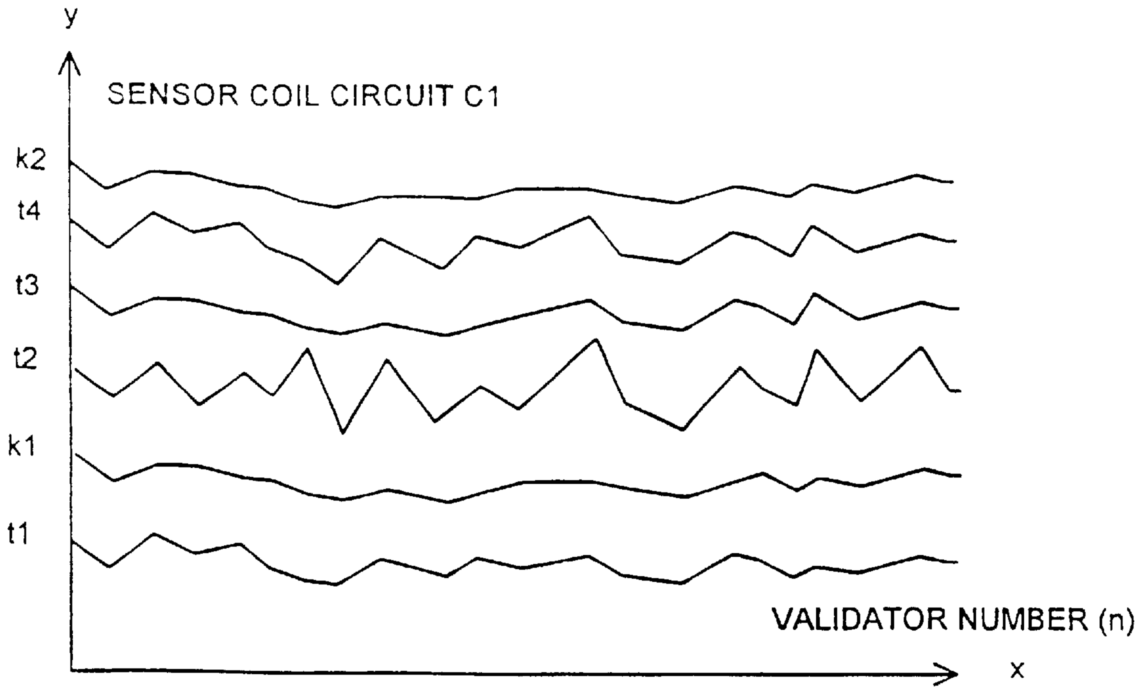
FIG. 13 is a graph illustrating a database of set of coin signals derived for a plurality of different test true coins and two calibration keys (y-axis) derived from a plurality (n) of coin validators in an ensemble thereof (x-axis) for use in a second example of the method of the invention.

In a second example of the calibration process, instead of forming the average values $k_{av}$ and $t_{2av}$ a database of validator data sets are derived from the ensemble of coin validators in the data collection step S1. Each data set consists of the calibration value produced in response to at least one of the keys $K_1$ or $K_2$ and a number of true coins $T_n$ that are passed through each validator of the ensemble. Thus, each data set comprises typically values k1, k2 of the sensor signal together with values t1, t2, t3 and t4 produced in response to corresponding true coins T1, T2, T3 and T4 passed through the validator. Typically, 50–200 such data sets are produced from the validators of the ensemble and a corresponding plot of the data is shown in FIG. 13.

Figure 14:
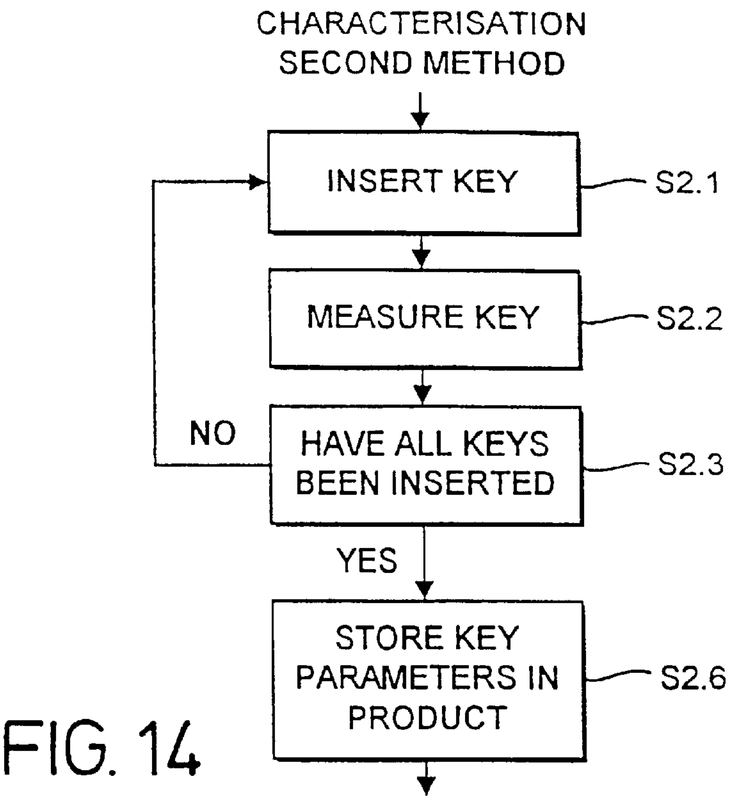
FIG. 14 illustrates a second example of the characterisation step of FIG. 6, for use with the database shown in FIG. 13.

During the characterisation step S2, data concerning the calibration values of the sensor signal for the two keys K1 and K2, namely Ik1 and 1k2 are stored in the memory 18 of the individual validator. This process is shown in FIG. 14 in which steps S2.1 to step S2.3 are performed as previously described and then the resulting values Ik1 and Ik2 are stored in the memory 18 of the validator being calibrated.

Figure 15:
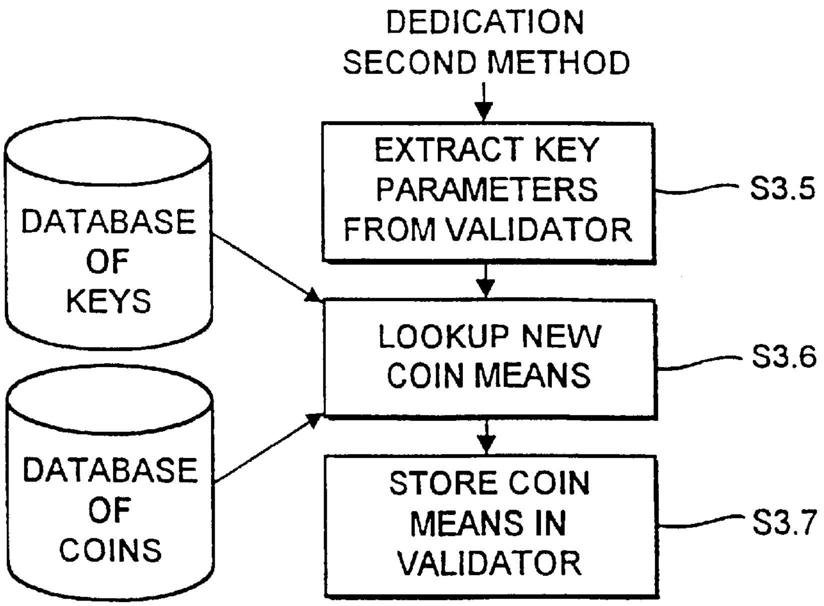
FIG. 15 illustrates a second example of the dedication step of FIG. 6, for use with the characterisation process described with reference to FIG. 14.

The dedication process is shown in FIG. 15. With the external processor 22 connected to the validator, the key parameters Ik1, Ik2 are extracted from the memory 18 of the vaiidator at step S3.5, and then at step S3.6, these values are compared with the stored data sets that were collected during step S1. The two values Ik1 and Ik2 are compared with the values of the data sets from the ensemble thereof in order to choose the set which most closely resembles the key values stored in the validator. In this way, a data set is chosen which most closely approximates to the characteristics of the validator being dedicated. In a modification, a number of the data sets from the ensemble may be chosen and the values thereof averaged, to reduce errors in the data.

Then, appropriate true coin values e.g t1, t2, t3 can be programmed into the memory 18 of the individual validator, depending on which coins it is desired to validate. As previously described, windows may be associated with each stored value in order to accommodate the differences in signals that occur for different true coins of the same denomination.

In a third example of a method according to the invention, the information held in the database shown in FIG. 13 is rearranged to allow selective reprogramming of validators in the field, for example by transmitting appropriate reprogramming data over a telephone line from the central station to the validator. It is assumed that the validator has in its memory a key parameter Ik1 and that its microprocessor includes a reprogramming sub-routine which can operate at the validator itself, rather than using an external processor such as processor 22.

The information concerning the database of FIG. 13 is held at a central location for transmission to validators in the field. The database is organised in such a way that the information can be readily transmitted to the validator.

In this example, it is assumed that the validator has already been programmed s with appropriate true coin values for coins t1, t2 and t3 in the manner described previously with reference to FIG. 15, and that subsequently, it is desired to program a value t4 for an additional true coin. To achieve this, the database of FIG. 13 is reorganised such that the values of t4 for each data set are considered as a difference relative to the value k1 for the set. Thus, for each data set, the value of t4 can be written as follows:

$$t4=k1+\Delta$$

Figure 16:
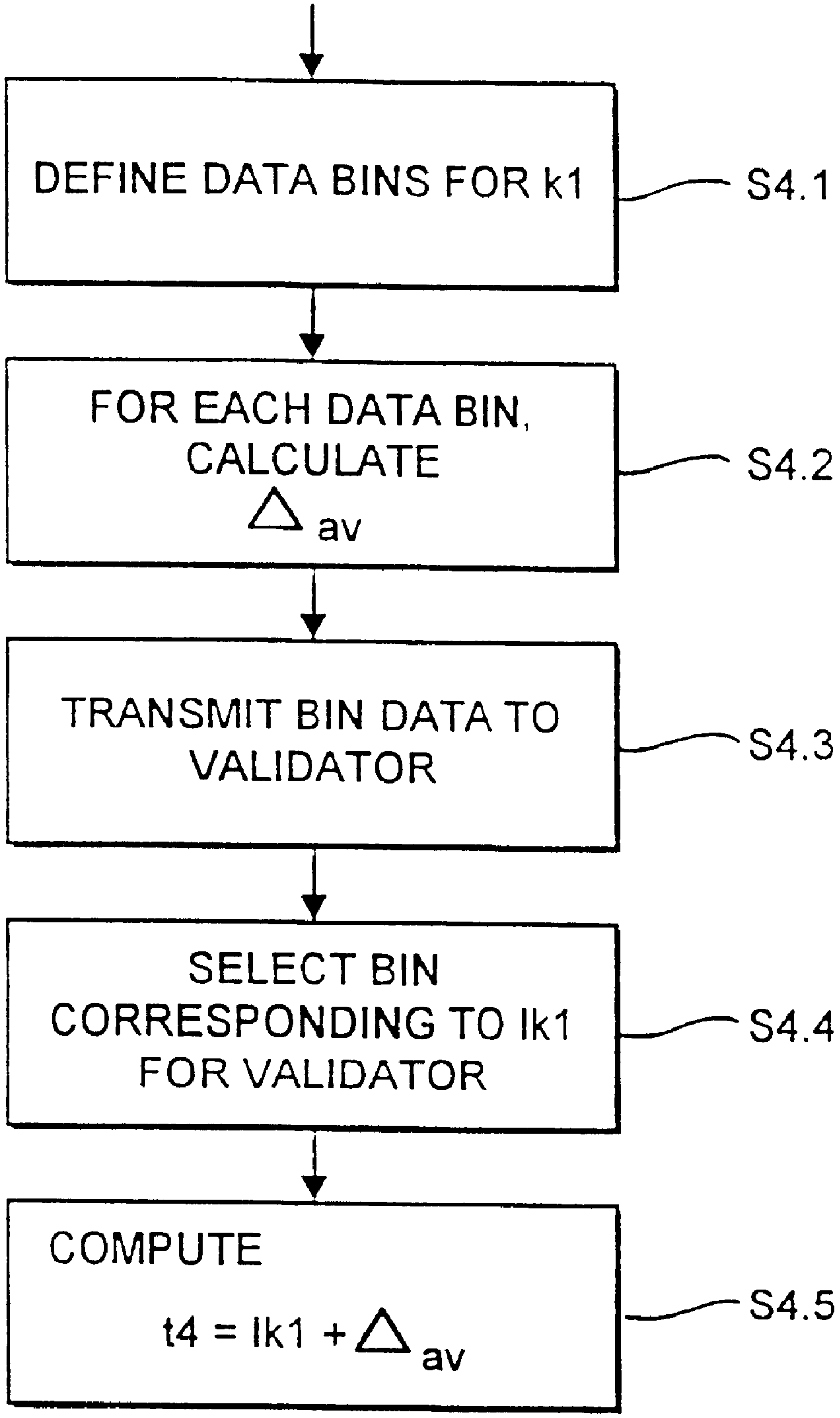
FIG. 16 is a schematic flow diagram of a third example of a method according to the invention, in which calibration data is transmitted to validators at remote locations from a central database.

It will be understood that the individual values of t4, k1 and Δ can be different in each data set. The data of FIG. 13 is reorganised so as to provide a series of "data bins" into which values of k1 between individual is ranges are collected. This is shown as step S4.1 in FIG. 16. It will be understood that the values of various parameters can be considered as count values as a result of the digital nature of the signals. In the following Table, three data bins are shown by way of example, for count values of k between 100.00–100.99; 101.00–101.99 and 102.00–102.99 although in practice, many more are used.

TABLE

| parameter | bin 1 | bin 2 | bin 3 |
|---|---|---|---|
| k1 | 100.00–100.99 | 101.00–101.99 | 102.00–102.99 |
| $\Delta_{2V}$ | 10.25 | 10.27 | 10.24 |

The various values of the data sets are collected into the bins for different values of k and at step S4.2, the values of Δ corresponding to the data sets for each bin are averaged so as to form a value $\Delta_{av}$. The resulting values of the data bins and corresponding values of $\Delta_{av}$ are then stored in a memory at the central location.

When it is desired to program the value of t4 into the memory of a validator at a remote location, the bin data as shown in the Table is transmitted digitally over a telephone line to the validator. For example, the validator can be considered to be at a remote location relative to the processor 22 of FIG. 5, e.g. in a pay telephone. The processor 22 stores the bin data shown in the foregoing Table, and is connected via a telephone line to the bus of the microprocessor 17 through interface circuitry (not shown). After an initial handshake procedure, the validator switches to a calibration mode and data concerning the ranges of values of k1 for the successive data bins, together with the associated values of $\Delta_{av}$ are transmitted to the validator from the processor 22, as shown at step S4.3. The validator retrieves its stored value of Ik1 and at step S4.5, notes when a bin which contains the value is received from the central location. The corresponding value of $\Delta_{av}$ for the selected bin is added at step S4.5 to the stored value of Ik1 so as to produce an appropriate value of t4 for the validator. Appropriate window values are computed around the value of t4 and the resulting upper and lower window limits are stored in the memory 18 of the validator. It will be understood that in practice bin data for more than one calibration key will be used.

It will be appreciated that this procedure permits selective reprogramming of the memory 18 in the field either to change the values associated with particular coins or to provide data for a new coin denomination. It will be understood that the data of the Table may be broadcast to a plurality of validators in the field simultaneously, in order that they may be reprogrammed simultaneously, without the need to extract their individual calibration values for external processing. Alternatively, the data of the Table may be transmitted to each validator individually in response to a request received from the validator. For example, for a coin validator in a telephone coin box, when a new validator is fitted, it may be programmed by the downloading the Table data through the telephone system to the coin box, from a remote location, the downloading being initiated by a request from the coin box control circuitry, in response to detection that a new validator has been fitted, e.g. in the event of a repair.

It has been found that the use of static calibration keys K has the advantage that the count values of the sensor signal that are produced have an improved accuracy as compared with the prior art arrangements which use tokens or coins which pass on a transitory basis past the coils C1, C2, C3. Also, it has been found that the use of data from an ensemble of coin validators gives a very accurate correlation between the individual value stored in the memory of a validator, for an acceptable coin, and the actual value needed to achieve acceptable coin discrimination. The use of the ensemble data has the advantage that it is no longer necessary to pass large numbers of coins of different denominations through each validator during manufacture, to calibrate its memory. Furthermore, the method may provide data stored in the memory of each validator which permits accurate reprogramming if it is desired to use the validator with a different currency set.

In practice there may be more than one production line for validators of the same design, so that it would be desirable to have more than one set of keys for calibration purposes. However, the keys need to have demonstrably identical characteristics, from set to set, in order to produce consistent calibration. In order to meet this requirement, the characteristics of the keys can be compared relative to a master key, in terms of the values $x_1$, $x_2$ and $x_3$ that they produce in an individual validator, and the difference between the value of say $x_1$, for one of the keys and a corresponding master key, can be stored in association with the key, and used as an offset in the actual calibration process.

Whilst the use of static keys is advantageous, it is possible to perform the method according to the invention by replacing the static key with known true coins which function as mobile calibration keys that are fed through the validator in the same manner as the coin being validated. For the second example described with reference to FIGS. 13 to 15, the values of known true coins T1 and T2 could be used for characterising the validator at step S2 (FIG. 14) and the values thereof could be compared with the values in the database during the dedication step S3 (FIG. 15).

The term "coin" herein includes a token or similar coin-like item of value.

What is claimed is:

1. A method of producing a calibration value for a coin validator that includes a path for coins to be validated and at least one inductive sensor for forming an inductive coupling with a coin as it passes along the path thereby to produce a sensor signal to be compared with coin data for determining authenticity of the coin, the sensor signal being of a value dependent upon characteristics of the validator, comprising:

inserting a calibration key different from coins to be validated in a static position in the validator, and operating the sensor so that eddy currents are induced in the key, resulting in the production of the calibration value of the sensor signal as a function of the individual characteristics of the validator.

2. A method according to claim 1 including associating upper and lower window limit values with the compensated value and storing the window limit values in the validator being calibrated.

3. A method according to claim 1 including sequentially inserting a plurality of different ones of said keys in the rundown path for forming different inductive couplings with the inductive sensor.

4. A method according to claim 1 including removing the key from the validator prior to use thereof for validating coins under test.

5. A method according to claim 1 wherein the path is disposed between sidewalls which are movable relative to one another, including moving the sidewalls apart, inserting the calibration key into the rundown path at a predetermined location, closing the sidewalls, and then forming said inductive coupling with the key.

6. A method according to claim 1 wherein the inductive sensor includes a plurality of inductor coils, and respective inductive couplings are formed between the coils and the key.

7. A method according to claim 6 wherein said couplings are produced sequentially.

8. A method according to claim 7 including energising the coils sequentially and monitoring the inductive coupling between the coils and the key.

9. A method according to claim 8 wherein each coil is connected in a circuit energised so that at least one of the phase, frequency and amplitude of the signal developed thereby varies in response to insertion of the calibration key.

10. A method according to claim 9 wherein each coil is connected in a respective resonant circuit energised in such a manner as to maintain the circuit at its natural resonant frequency when a coin to be validated passes the coil and when the calibration key is inserted, the method including monitoring the deviation in amplitude of the signal produced in the resonant circuit in response to insertion of the calibration key, whereby to produce the calibration signal.

11. A method of providing data for calibrating a coin validator that includes a path for coins to be validated and at least one inductive sensor for forming an inductive coupling with a coin as it passes along the path thereby to produce a sensor signal to be compared with coin data for determining authenticity of the coin, the sensor signal being of a value dependent upon characteristics of the validator, comprising:

inserting a calibration key different from coins to be validated in a static position in the validator, operating the sensor so as to produce an inductive coupling with the calibration key and thereby producing a calibration value of the sensor signal as a function of the individual characteristics of the validator, comparing the calibration value of the sensor signal with ensemble data concerning corresponding calibration values of the sensor signal derived from an ensemble of coin validators of said design, and determining as a function of the comparison, for said validator being calibrated, data corresponding to the value of the sensor signal for a particular coin denomination, that is compensated in respect of the individual characteristics of the validator.

12. A method according to claim 11 wherein the ensemble data includes said data concerning corresponding calibration values of the sensor signal derived from an ensemble of coin validators of said design and data concerning sensor signals produced by validators of the ensemble in response to a true coin of said particular denomination.

13. A method according to claim 12 wherein the calibration value of the sensor signal is compared with ensemble data comprising an ensemble average of corresponding calibration values of the sensor signal derived from said ensemble of coin validators of said design and an ensemble average of sensor signals produced in response to a true coin of a particular denomination such as to derive said compensated value of the sensor signal for said denomination for said validator being calibrated.

14. A method according to claim 1, including storing data concerning the compensated value of the sensor signal in the validator being calibrated.

15. A method according to claim 11, including storing data concerning the calibration value of the sensor signal in the validator.

16. A method according to claim 15 including subsequently computing a compensated value of the sensor signal for a coin of a different denomination by reference to said stored value of the calibration signal and an ensemble average of the sensor signal for the different denomination.

17. A method according to claim 11 wherein the calibration value of the sensor signal is compared with data from a database of validator data sets derived from said ensemble of coin validators of said design, each set comprising said calibration value for a respective individual validator of the ensemble and a value of the sensor signal produced in response to a true coin of a particular denomination by the individual validator.

18. A method according to claim 17 including selecting data from the data sets in dependence upon a comparison of the sensor signal calibration value for the validator being calibrated, with the corresponding calibration values of the data sets.

19. A method according to claim 17 including forming from the data sets, a plurality of average values of the difference between the calibration value of the sensor signal and the corresponding sensor signal value for the true coin, for the data sets in which the calibration value of the sensor signal falls within predetermined respective ranges of values thereof.

20. A method according to claim 19 including transmitting data concerning said ranges and the average values to the coin validator to be calibrated, selecting one of said ranges by comparing the calibration value of the sensor signal for the validator being calibrated with said ranges, and combining said average value for the selected range with the calibration value of the sensor signal for the validator being calibrated whereby to provide the compensated value of the sensor signal for the validator being calibrated.

21. A method according to claim 20 wherein the transmitted data is fed from a central location to a plurality of validators to be calibrated at remote locations.

22. Coin validator calibration apparatus including a coin validator that includes a path for coins to be validated and at least one inductor to form an inductive coupling with a coin as it passes along the path thereby to produce a sensor signal to be compared with coin data to determine authenticity of the coin, the sensor signal being of a value dependent upon characteristics of the validator, and a calibration key, different from coins to be validated, configured to be mountable in a static position in the validator such that eddy currents are induced in the key by operation of the inductor, so as to produce a calibration value of the sensor signal as a function of the individual characteristics of the validator.

23. Coin validator calibration apparatus according to claim 22 wherein the key is of a shape which self-locates in the path at a predetermined location.

24. Coin validator calibration according to claim 22 wherein the key includes a pin that is received in a corresponding recess in the coin rundown path.

25. Coin validator calibration apparatus according to claim 22 including a carrier for the key, to be removably fitted in the validator.

26. Coin validator calibration apparatus according to claim 22 including a plurality of said keys for forming different inductive couplings with the inductor.

27. Coin validator calibration apparatus according to claim 22 wherein the inductor comprises a plurality of coils at spaced locations relative to the coin path, and the key is configured to produce different respective inductive couplings with the coils.

28. Coin validator calibration apparatus according to claim 27 wherein the key comprises a metal plate.

29. A method of producing a calibration value for a coin validator to be calibrated, the validator being of a predetermined design that includes a path for coins to be validated and at least one inductive sensor for forming an inductive coupling with a coin as it passes along the path thereby to produce a sensor signal to be compared with coin data for determining authenticity of the coin, the sensor signal being of a value dependent upon characteristics which vary from validator to validator, the method comprising:

producing a calibration value of the sensor signal for the validator to be calibrated as a function of individual characteristics of the validator, by forming a calibration inductive coupling with the inductive sensor, providing ensemble data concerning corresponding calibration values of the sensor signal derived previously from an ensemble of other coin validators of said design and sensor signals previously produced by the validators of the ensemble in response to a true coin of a particular denomination, comparing the calibration value of the sensor signal from the validator to be calibrated with the ensemble data, and deriving for said validator to be calibrated a value of the sensor signal for said coin denomination that is compensated in respect of the individual characteristics of the validator, said ensemble data being configured as a database of validator data sets derived from said ensemble of coin validators of said design, each data set comprising the calibration value produced by a respective individual validator of the ensemble and a value of the sensor signal produced in response to a true coin of a particular denomination by the individual validator.

30. A method according to claim 29 including selecting data from the data sets in dependence upon a comparison of the sensor signal calibration value for the validator being calibrated, with the corresponding calibration values of the data sets.

31. A method according to claim 29 including forming from the data sets, a plurality of average values of the difference between the calibration value of the sensor signal and the corresponding sensor value for the true coin, for the data sets in which the calibration value of the sensor signal falls within predetermined respective ranges of values thereof.

32. A method according to claim 31 including transmitting data concerning said ranges and the average values to the coin validator to be calibrated, selecting one of said ranges by comparing the calibration value of the sensor signal for the validator being calibrated with said ranges, and combining said average value for the selected range with the calibration value of the sensor signal for the validator being calibrated whereby to provide the compensated value of the sensor signal for the validator being calibrated.

33. A method according to claim 29 including associating upper and lower window limit values with the compensated value and storing the window limit values in the validator being calibrated.

34. A method according to claim 33 wherein the transmitted data is fed from a central location to a plurality of validators to be calibrated at remote locations.

35. A method according to claim 33 wherein the transmitted data is fed from a central location to an individual validator to be calibrated at a remote location, in response to a request from the validator.

* * * * *